United States Patent [19]

Kinouchi et al.

[11] Patent Number: 5,521,641
[45] Date of Patent: May 28, 1996

[54] IMAGE DATA CODING APPARATUS AND METHOD

[75] Inventors: Shigenori Kinouchi; Akira Sawada, both of Tokyo, Japan

[73] Assignee: NEC Corporation, Tokyo, Japan

[21] Appl. No.: 223,003

[22] Filed: Apr. 5, 1994

[30] Foreign Application Priority Data

Apr. 14, 1993 [JP] Japan ................................. 5-086610

[51] Int. Cl.⁶ ................................................ H04N 7/34
[52] U.S. Cl. ....................... 348/401; 358/261.2; 382/245
[58] Field of Search ............................ 358/261.1, 261.2, 358/261.3, 427, 426; 341/65; 348/409, 415, 400, 401, 403; 382/245; H04N 7/66

[56] References Cited

U.S. PATENT DOCUMENTS

| | | | |
|---|---|---|---|
| 4,040,093 | 8/1977 | Nakagome et al. | 358/261.3 |
| 4,134,133 | 1/1979 | Teramura et al. | 358/261.3 |
| 5,319,469 | 6/1994 | Moolenaar | 358/427 |

OTHER PUBLICATIONS

Hatori, "Introduction to Image Data Compression: (4) Image Data Coding Algorithm I—Predictive Coding", 1989, Television Society of Japan Proceedings V43, N9, pp. 949–956.

*Primary Examiner*—Thai Q. Tran
*Assistant Examiner*—A. Au
*Attorney, Agent, or Firm*—Whitham, Curtis, Whitham & McGinn

[57] ABSTRACT

An image data coding apparatus and method to achieve a scale-down of a circuit without sacrificing compression efficiency. Input image data is delayed in a delay circuit and a coincidence detector compares the image data and delay image data to output a coincident code when these two are the same. An adaptive run length counter adaptively switches to select either a coincident code run length of a continuous length of the coincident codes calculated at an output time of the coincident codes or an image data run length of a continuous length of the same codes of the image data calculated at a non-output time of the coincident codes and outputs an adaptive run length. A Huffman coder carries out a Huffman coding of the adaptive run length.

2 Claims, 3 Drawing Sheets

IMAGE DATA CODING APPARATUS AND METHOD

BACKGROUND OF THE INVENTION

The present invention relates to an image data coding apparatus for effectively compressing and coding image data and an image data coding method for effectively compressing and coding the image data.

DESCRIPTION OF THE RELATED ARTS

In a computer for playing games, a scale-down of a circuit is also desired in a hardware used for a game image display for cost reduction. Hence, with a small memory capacity a variety of image are displayed and thus an image data compression by a high performance coding such as the Huffman coding is widely used. As well-known, this Huffman coding is a kind of a run length coding where different code lengths are assigned depending on appearance frequency of run lengths or the continuous lengths of the same value of coded data of pixels of original signals so as to reduce average code lengths when coding.

Conventionally, as an image data coding apparatus for carrying out an image data compression of this kind, for example, there is a predictive coding circuit by a differential circuit, explaining a predictive coding algorithm by which a signal to be input next is predicted from already known coded signals and by sending a signal for a part departed from the prediction, information content required for the coding can be saved in an image data compression technique, as disclosed in Television Society of Japan Proceedings Vol. 43, No. 9, pp. 949–956, 1989. In this conventional image data coding apparatus, a difference between input image data composed of a plurality of coded pixel data and delay image data obtained by delaying the input image data for one horizontal scanning period (hereinafter referred to as "one line") is calculated and a differential data run length of the same value continuous length of this differential data is counted in the first method or the aforementioned differential data run length and the input image run length of the same value continuous length of the aforementioned input image data are adaptively switched to count the selected one in the second method.

FIG. 1 illustrates a conventional image data coding apparatus of the first method, which is comprised of a delay circuit 11 for delaying input image data P for one line of time to output delay image data PD, a differential circuit 12 for calculating a difference between the input image data P and the delay image data PD to output differential data DD, a run length counter 13 for counting continuous lengths of the same difference value as the differential data DD to obtain a run length RL, a Huffman table 15 which is provided within a memory (not shown) and is composed of a table containing output codes corresponding to the run lengths RL for a Huffman coding, and a coder 14 for carrying out the Huffman coding of the run length RL by using the Huffman table 15. As is well known, a run length signal to be input to a Huffman table has information on the run length of a certain data and a data value of this data.

The operation of this conventional image data coding apparatus will now be described. First, the input image data P are supplied to the delay circuit 11 and the differential circuit 12. In response to the supply of the image data P, the delay circuit 11 outputs the delay image data PD to the differential circuit 12. The differential circuit 12 calculates the difference between the pixel data values corresponding to the image data P and the delay image data PD and supplies the differential data DD to the run length counter 13. The run length counter 13 counts up the continuous numbers (lengths) of the same difference value whose difference values are the same to obtain the run length RL and sends this run length RL to the coder 14. The coder 14 executes the coding of the supplied run length RL by using the Huffman table 15 to output coded data CD.

The required capacity of the Huffman table 15 becomes a value of (color number ×2−1)×the run length RL. For example, in the case of the image data coded by color pallet codes of 16 colors, the pixels of the image data are expressed by 4-bit color codes, that is, '0000' to '1111'. When these color codes are supplied as the image data P, the value of a range of −15 to +15 as the difference value can be obtained. Hence, the necessary capacity of the Huffman table 15 becomes the value of (16×2−1)×the run length RL.

FIG. 2 shown another conventional image data coding apparatus of the second method, which is comprised of, in addition to the delay circuit 11, the differential circuit 12, coder 14 and the Huffman table 15 in the same manner as the first method, an adaptive run length counter 16 in place of the run length counter 13, which adaptively counts up either the same difference values of the differential data DD or the same values of the image data P to output either the run length RL of the differential data DD or the run length RLP of the image data P.

The operation of this conventional image data coding apparatus will now be described. The delay circuit 11 and the differential circuit 12 operate in the same manner as the aforementioned first method. Next, to the run length counter 16, the image data P in addition to the differential data DD are supplied and either the run length RL of the differential data DD or the run length RLP of the image data P are adaptively obtained. The run length counter 16 supplies the obtained run length to the Huffman coder 14. The coder 14 carries out the coding of either the run length RL or the run length RLP by using the Huffman table 15 in the same manner as the first method to output the coded data CD. In this case, the necessary capacity of the Huffman table 15 under the same condition as the first method becomes {(color number×2−1)+color number}×the run length RL, that is, {(16×2−1)+16}×the run length RL.

In the above-described conventional image data coding apparatuses, the necessary capacity of the Huffman table is approximately twice the color number×the run length. Hence the memory capacity for storing the Huffman table is large and as a result, the circuit scale becomes large.

SUMMARY OF THE INVENTION

It is therefore an object of the present invention to provide an image data coding apparatus in view of the aforementioned defects of the prior art, which is capable of reducing a necessary capacity of a Huffman table to miniaturize a memory for storing the Huffman table and to achieve a scale-down of a circuit.

It is another object of the present invention to provide an image data coding method which is capable of reducing a necessary capacity of a Huffman table to miniaturize a memory for storing the Huffman table and to achieve a scale-down of a circuit.

In accordance with one aspect of the present invention, there is provided an image data coding apparatus, comprising delay means for delaying input image data composed of a plurality of coded image data for a predetermined time to output delay image data; coincidence detecting means for detecting coincidence between codes of the input image data and the delay image data to output a coincident code when the codes are coincident with each other; adaptive run length processing means for adaptively switching to select either a coincident code run length of a continuous length of the coincident codes calculated at an output time of the coincident codes or an image data run length of a continuous length of the same codes of the image data calculated at a non-output time of the coincident codes to output an adaptive run length; and Huffman coding means for carrying out a Huffman coding of the adaptive run length.

In accordance with another aspect of the present invention, there is provided an image data coding method, comprising the steps of delaying input image data composed of a plurality of coded image data for a predetermined time by delay means to output delay image data; detecting coincidence between codes of the input image data and the delay image data by coincidence detecting means to output a coincident code when the codes are coincident with each other; adaptively switching to select either a coincident code run length of a continuous length of the coincident codes calculated at an output time of the coincident codes or an image data run length of a continuous length of the same codes of the image data calculated at a non-output time of the coincident codes by adaptive run length processing means to output an adaptive run length; and carrying out a Huffman coding of the adaptive run length by Huffman coding means.

The coincident codes and the codes of the image data are compared with their respective previous codes and the codes changed earlier are used as effective data to produce the adaptive run length when both the coincident code and the code of the image data are equal to their respective previous codes. A longer continuous length is used as the effective data when the run length of the codes is at most three.

The continuous length of the coincident codes is compared with the continuous length of the same codes and a longer continuous length is used as effective data to produce the adaptive run length.

The continuous length of the coincident codes is compared with the continuous length of the same codes and the continuous length of the same codes is used as effective data to produce the adaptive run length when both the continuous lengths are equal.

The continuous length of the coincident codes is compared with the continuous length of the same codes with respect to a decision point and a longer continuous length is used as effective data to produce the adaptive run length.

The continuous length of the coincident codes is compared with the continuous length of the same codes with respect to a decision point and the continuous length of the same codes is used as effective data to produce the adaptive run length when both the continuous lengths are equal.

The continuous length of the coincident codes is compared with the continuous length of the same codes with respect to a decision point and a shorter continuous length is used as effective data to produce the adaptive run length.

An overlap portion of code value change is allocated half and half to both the coincident code run length and the image data run length as effective data to produce the adaptive run length.

An overlap portion of code value change is divided so that the coincident code run length and the image data run length may be equal and the divided overlap portion is allocated to both the coincident code run length and the image data run length as effective data to produce the adaptive run length.

According to the present invention, the necessary capacity of the Huffman table is reduced to approximately equal to or less than the half of the conventional case and thus the memory for storing the Huffman table can be miniaturized to achieve the scale-down of the circuit.

BRIEF DESCRIPTION OF THE DRAWINGS

The objects, features and advantages of the present invention will become more apparent from the consideration of the following detailed description, taken in conjunction with the accompanying drawings, in which:

FIG. 4 is a block diagram of an exemplary adaptive run length counter according to the embodiment shown in FIG. 3.

DESCRIPTION OF THE PREFERRED EMBODIMENTS

Figure 1:
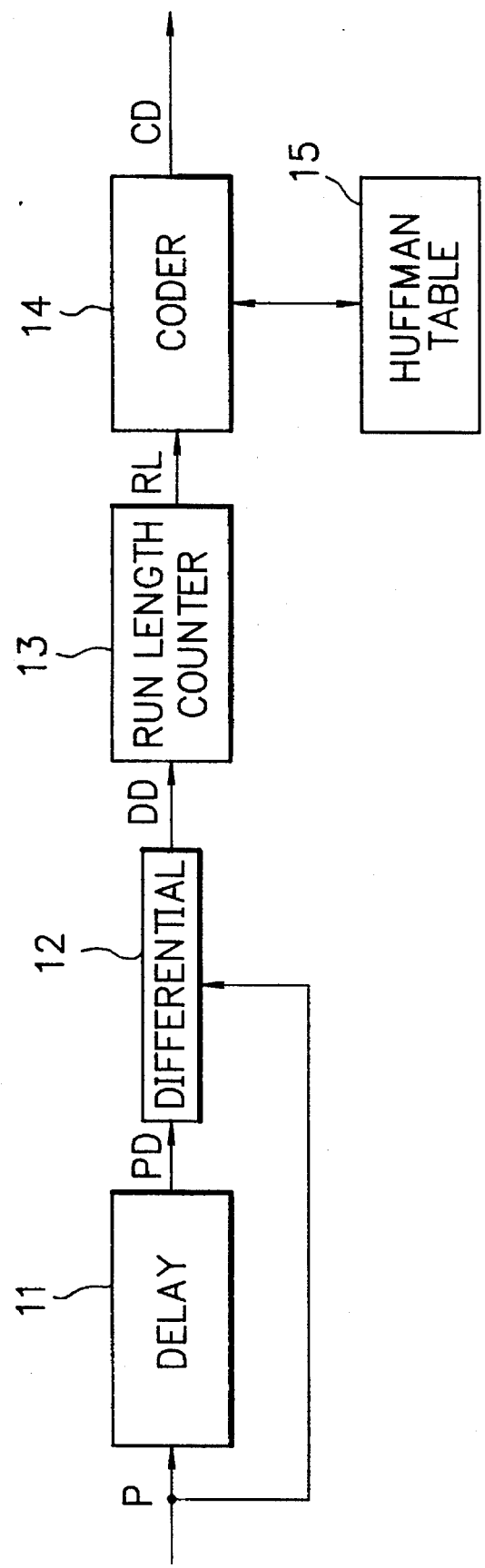
FIG. 1 is a block diagram of a conventional image data coding apparatus.
Figure 2:
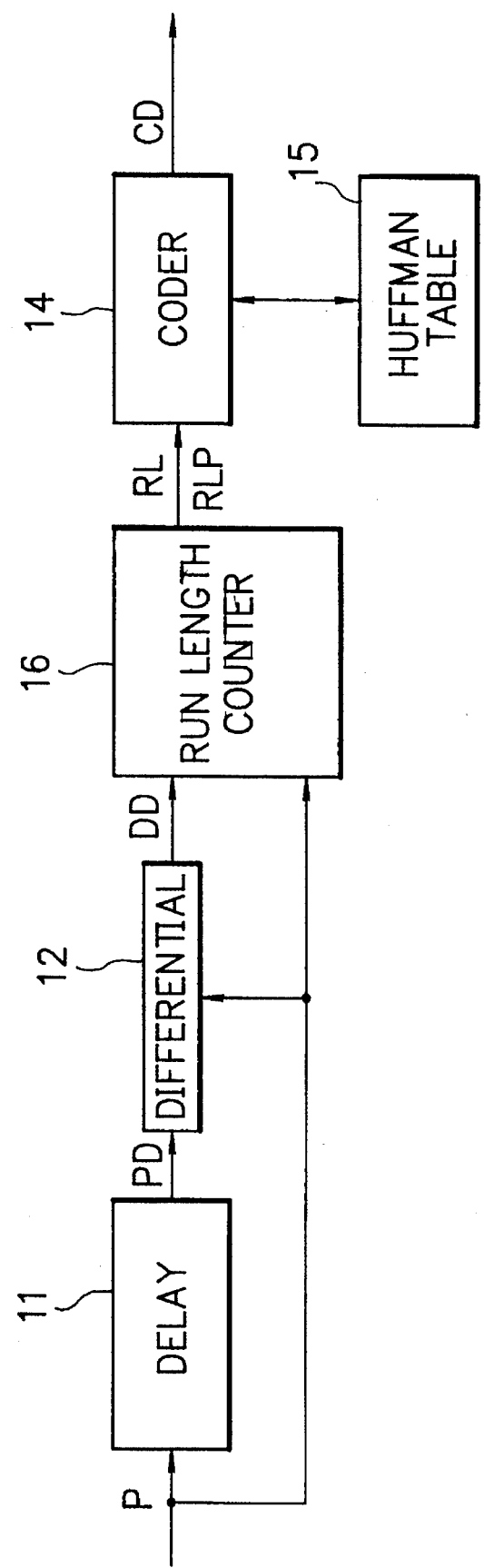
FIG. 2 is a block diagram of another conventional image data coding apparatus.
Figure 3:
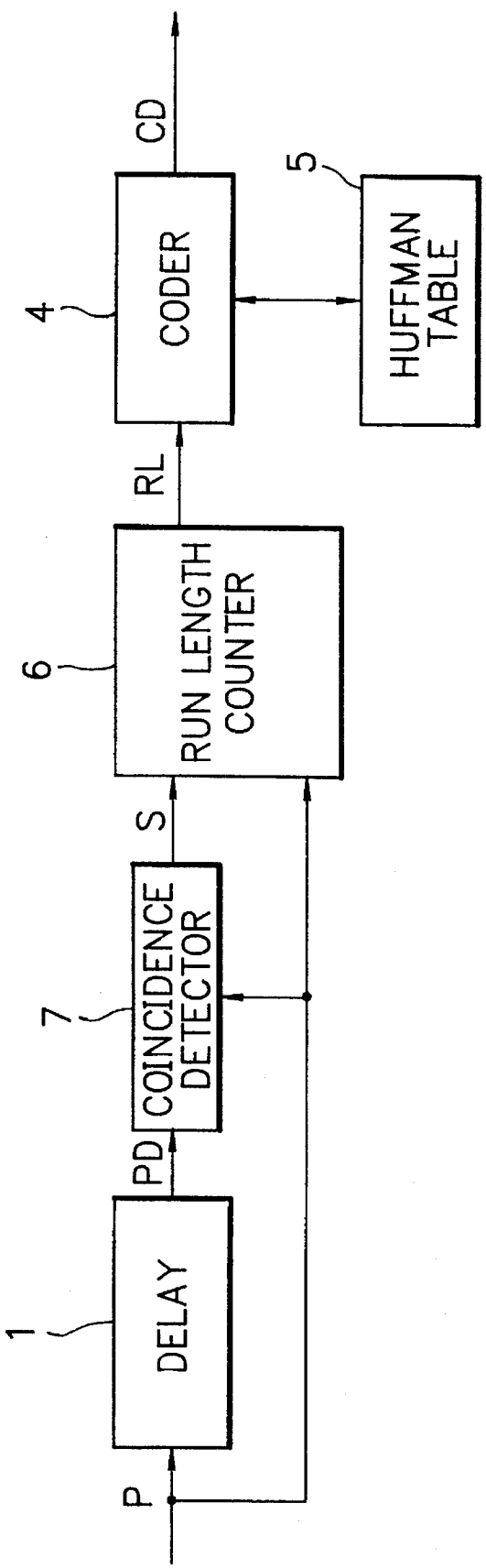
FIG. 3 is a block diagram of an image data coding apparatus according to the present invention.

Referring now to the drawings, there is shown in FIG. 3 one embodiment of an image data coding apparatus according to the present invention.

As shown in FIG. 3, the image data coding apparatus comprises, in addition to a delay circuit 1, a run length counter 6, a coder 4 and a Huffman table 5 having the same constructions and functions as those of the conventional image data coding apparatus described above, a coincidence detector 7 in place of the differential circuit 12 of the conventional apparatus, which inputs image data P and delay image data PD and detects coincidence between coded pixel data values constituting the image data P and the delay image data PD to output a coincident code S when the two coded pixel data values are coincident with each other.

Next, the operation of the image data coding apparatus described above will now be described.

In this embodiment, like the conventional image data coding apparatus, it is assumed that the image data P are composed of pixel data coded by color pallet codes of 16 colors and the pixel data are represented by 4-bit color codes, that is, '0000' to '1111' and that one line of pixel data of the image data P are 16.

First, assuming that a first line of image data P1 is '2123233213344132' and a next or second line of image data P2 is '2123233333344444', the image data P1 and P2 are successively supplied to the delay circuit 1, the coincidence detector 7 and the run length counter 6. At the supply of the image data P2, the coincidence detector 7 detects whether or not the codes every image data between the delay image data PD1 corresponding to the image data P1 output from the delay circuit 1 and the next image data P2 are coincident with each other and, as shown in Table 1, outputs code coincident parts between the image data PD1 and P2 as the coincident codes S to the run length counter 6.

TABLE 1

| Pixel No. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| P2 | 2 | 1 | 2 | 3 | 2 | 3 | 3 | 3 | 3 | 3 | 3 | 4 | 4 | 4 | 4 | 4 |
| PD1 | 2 | 1 | 2 | 3 | 2 | 3 | 3 | 2 | 1 | 3 | 3 | 4 | 4 | 1 | 3 | 2 |
| Coincidence Code | S | S | S | S | S | S | S |   |   | S | S | S | S |   |   |   |

The coincidence detector 7 can be composed of 4 EXNOR circuits for executing a non-equivalence operation of bits corresponding to the respective image data P2 and PD1 and 4 AND gates for carrying out an AND operation of the outputs of the 4 EXNOR circuits.

A processing rule of the adaptive run length counter 6 is to obtain the run length RL as long as possible and, as shown in Table 2, when the coincident codes S and the codes of the image data P2 are both equal to their previous codes, the code outputs changed earlier are adopted as effective data and are all counted up to output the counted result as the run length RL. In this case, in the event that the run

TABLE 2

| Pixel No. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| P2 | 2 | 1 | 2 | 3 | 2 | 3 | 3 | 3 | 3 | 3 | 3 | 4 | 4 | 4 | 4 | 4 |
| S | S | S | S | S | S | S | S |   |   | S | S | S | S |   |   |   |
| RL | S | S | S | S | S | S | S | 3 | 3 | 3 | 3 | 4 | 4 | 4 | 4 | 4 | length of the codes is at most three, the longer continuous length is used as the effective data of the run length RL. This first rule is referred to as earlier change rule. In this case, the change means the change of the code values concerning the image data P2 and also means the change of the existence or nonexistence of the code S respecting the coincident code S. In this embodiment, the first to seventh pixels and the tenth to thirteenth pixels are the coincident parts and the coincident codes S are output in these parts. The code values of the image data P2 are changed from 2 to 3 at the fifth to sixth pixels and from 3 to 4 at the eleventh to twelfth pixels. The coincident code S disappears at the eighth pixel and the fourteenth pixel and appears at the tenth pixel. As a result, the coincident code S (=3) and the code values 3 of the image data P2 are the same at the sixth and seventh pixels and the tenth and eleventh pixels and the coincident codes S (=4) and the code values 4 are the same at the twelfth and thirteenth pixels. Since the code changed earlier is used as the effective data, at the sixth and seventh pixels, the counted result of the coincident code S continuing from the first pixel and at the tenth and eleventh pixels, the counted result of the code value 3 of the image data P2 already existed from the eighth pixel are output as the run length RL. Regarding the twelfth and thirteenth pixels, although the coincident code S should be taken pursuant to the aforementioned processing rule. However, since the run length of the coincident codes S is only two, the code value 4 of the longer image data P2 than the coincident codes S is used and its counted result is output as the run length RL. Therefore, the run length counter 6 outputs the counted result of 'SSSSSSS333344444' as the run length RL so as to supply the run length RL to the Huffman coder 4. The Huffman coder 4 performs the coding of the run length RL by using the Huffman table 5 to output the coded data CD.

The processing rule of the run length counter 6 is not restricted to the first rule of the earlier change rule and various rules can be possible. Some examples of the rules will now be described as follows.

First, as the second rule, a longer preference rule is given. That is, when both the coincident codes S and the codes of the image data P2 are changed, the continuous lengths of the respective codes are compared with each other and the longer one, that is, the codes of the longer run length is used as the effective data of the run length RL. In this case, in the case where the continuous lengths of the coincident codes S and the codes of the image data P2 are equal, the codes of the image data P2 have priority and this will be adapted to the following rules. In this case, assuming that the image data P are the same as the case of the above-described first rule shown in Table 1, the run length RL becomes the counted result of 'SSSSSSS333344444' which is the same as the case of the first rule.

Next, as the third rule, when both the coincident codes S and the codes of the image data P2 are changed in the same manner as the cases of the first and second rules, a first decision point is determined at the position of the pixel followed after the pixel from which the code of one of the coincident codes S and the image data P2 is already changed. The code continuous lengths of the coincident codes S and the image data P2 from the pixel of the first decision point are compared with each other and the longer one, that is, the codes of the longer run length are used as the effective data of the run length RL. That is, when the code continuous length of the image data P2 is longer than that of the coincident codes S, the codes of the image data P2 are counted from the code changed pixel or the previous pixel of the first decision point pixel. A second decision point is also determined at the position of the pixel followed after the pixel from which the coincident code S is changed and the code continuous lengths of the image data P2 and the coincident codes S from the pixel of the second decision point are compared with each other. And the codes of the longer one are used as the effective data of the run length RL. More specifically, now, assuming that the image data P are the same as the case of the above-described first rule shown in Table 1, as shown in Table 3, the first decision point is the seventh pixel next to the sixth pixel at which the code of the image data P2 is changed from 2 to 3 and the continuous length of the code 3 of the image data P2 is 6 of the sixth to eleventh pixels. On the other hand, the continuous length of the coincident codes S from the

TABLE 3

| Decision point | | | | | | | 1 | | | | 2 | | | | |
|---|---|---|---|---|---|---|---|---|---|---|---|---|---|---|---|
| Pixel No. | 1 | 2 | 3 | 4 | 5 | 6 | 7 | 8 | 9 | 10 | 11 | 12 | 13 | 14 | 15 | 16 |
| P2 | 2 | 1 | 2 | 3 | 2 | 3 | 3 | 3 | 3 | 3 | 3 | 4 | 4 | 4 | 4 | 4 |
| S | S | S | S | S | S | S | S | | | S | S | S | S | | | |
| RL | S | S | S | S | S | 3 | 3 | 3 | 3 | 3 | 3 | 4 | 4 | 4 | 4 | 4 | eighth pixel after the seventh pixel is 0 and hence at the sixth and seventh pixels, the code 3 of the image data P2 is used as the effective data of the run length RL. The second decision point is the eleventh pixel after next to the tenth pixel at which the coincident code S appears again and, when the continuous length 5 of the code value 4 of the image data P2 from the twelfth pixel after the eleventh pixel is compared with the continuous length 4 of the present coincident codes S, the former is longer. Accordingly, at the overlapped parts of the tenth to thirteenth pixels, the code values 3 and 4 of the image data P2 are used as the effective data of the run length RL. As a result, the run length RL becomes the counted result of 'SSSSS33333344444', as shown in Table 3.

Next, as the fourth rule, a mixed system of the second and third rules is given. That is, first, at the first decision point in the third rule, a longer preference decision of the second rule is taken place and in the case where the continuous length of the coincident codes S is longer, the coincident code S is employed as the effective data of the run length RL. In turn, in the event that the continuous length of the codes of the image data P2 is longer, the processing according to the third rule is performed.

Under the condition of the same image data of the third rule, at the seventh pixel of the first decision point, the continuous length of the coincident codes S is longer and thus the coincident code S as the codes of the sixth and seventh pixels is used as the effective data of the run length RL. As regards the following pixels, the run length RL is obtained pursuant to the second rule. That is, the code values 3 and 4 of the image data P2 are employed at the tenth and eleventh pixels and the eleventh and twelfth pixels, respectively, as the effective data of the run length RL. As a result, the run length RL is the counted result of 'SSSSSSS333344444' which is the same result as the first and second rules.

Then, as the fifth rule, a modification of the mixed system of the second and third rules is given. First, at the first decision point of the third rule, a shorter preference rule against the second rule is carried out and in the case where the continuous length of the coincident codes S is shorter, the coincident code S is used as the effective data of the run length RL. On the other hand, in the case where the continuous length of the codes of the image data P2 is shorter, the processing pursuant to the third rule is executed.

In this case, at the seventh pixel of the first decision point in the third rule, the continuous length of the code values of the image data P2 is shorter. Hence, at the sixth, seventh, tenth and eleventh pixels, the code value 3 of the image data P2 is used as the effective data of the run length RL according to the third rule and at the twelfth and thirteenth pixels, the code value 4 of the image data P2 is used as the effective data of the run length RL. As a result, the run length RL is the counted result of 'SSSSS33333344444' in the same manner as the third rule.

Next, as the sixth rule, when both the coincident codes S and the codes of the image data P2 are varied, the overlap portion of the code value change is allocated half and half to both parts as the effective data of the run length RL.

In this case, in the overlap portion of the sixth and seventh pixels, the coincident code S and the code value 3 of the image data P2 are assigned to the sixth pixel and the seventh pixel, respectively. At the tenth and eleventh pixels and the twelfth and thirteenth pixels, so as to lengthen the output run length RL rather than the half and half allocation, the code value 3 of the image data P2 is used at the former part and the code value 4 of the image data P2 is employed at the latter part. As a result, the run length RL is the counted result of 'SSSSSS3333344444'.

Then, as the seventh rule, when both the coincident codes S and the codes of the image data P2 are changed, the overlap portions of the code value change are divided so that the run lengths of the divisions may be equal and the coincident code S and the code value of the image data P2 are allocated to both the divisions as the effective data of the run length RL (an equal run length rule). In this case, when the equal dividing can not be carried out, the image data P2 takes preference.

In this case, in the overlap portion of sixth and seventh pixels, when the code value 3 of the image data P2 is allocated to the sixth and seventh pixels, the run length of the code value 3 becomes 6 and the run length of the coincident code S becomes 5. On the other hand, when the coincident code S is assigned only to the sixth pixel, the run length of the code value 3 becomes 5 and the run length of the coincident code S becomes 6. Hence, in both cases, the run lengths of both the parts become not equal. As described above, in such cases, since the image data P2 have preference, the code value 3 of the image data P2 is employed at the sixth and seventh pixels. The other parts are processed in the same manner as the first to fifth rules. As a result, the run length RL becomes the counted result of 'SSSSS33333344444' in the same manner as the third and fifth rules.

Further, the required capacity of the Huffman table 5 has the value {(color number+1)×the run length RL}. For example, in the case of the image data coded by the color pallet codes of 16 colors, the necessary capacity of the Huffman table 5 becomes the value {(16+1)×the run length RL}. This corresponds to approximately the half of the conventional case such as {(16×2−1)×the run length RL} or [{(16×2−1)+16}×the run length RL].

In this embodiment, although the case of the line correlation using one line delay has been described, of course, the present invention can be applicable to a frame correlation using one frame delay.

Accordingly, as shown in FIG. 4, the adaptive run length counter 6 includes a counter 61 for counting the run length of the image data P2 as described with reference to FIG. 3, above. Another counter 62 counts the run length of the coincidence signal S as also described with respect to FIG. 3, above. A selection circuit 64 adaptively selects between the image data and the coincidence signal to produce the effective data, as also described with respect to FIG. 3, above. The signal generation circuit 65 outputs the run length signal RL as similarly described with respect to FIG. 3, above.

As described above, in the image data coding apparatus according to the present invention, by providing the coincidence detector for outputting the coincident code of the pixel data between the input image data and the delayed image data and the adaptive run length counter which adaptively switches to output either the coincident code run length calculated at the time of the coincident code output and the run length of the same code of the pixels of the input image calculated at the time of the non-output of the coincident code, the necessary capacity of the Huffman table is reduced to approximately equal to or less than the half of the conventional case and thus the memory for storing the Huffman table can be miniaturized to achieve the scale-down of the circuit without sacrificing compression efficiency.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An image data coding apparatus for coding, into a compressed data sequence, data sequences including a first data sequence comprising M first data elements in which the i-th data element of said first data elements includes a first image data of a set of coded image data, said first data elements differing among m different data values and a second data sequence comprising M second data elements in which the i-th data element of said second data elements includes a second image data of said set of coded image data, said second data elements differing among m different data values, where M and m are predetermined integers, respectively, and i is an arbitrary integer such that $1 \leq i \leq M$, said apparatus comprising:

delay means for delaying said first data sequence for a predetermined time to output a third data sequence comprising M third data elements in which the i-th data element of said third data elements includes said i-th first data element delayed, said third data elements have a value among m different data values;

a coincidence detecting means for detecting a coincidence between said i-th second data element and said i-th third data element and for outputting a coded detection signal representative of said coincidence, said detection signal being distinctive from said m data values, said detection signals comprising a fourth data sequence comprising M fourth data elements, the i-th data element of said fourth data elements comprising a detection value when said detection signal is present and a non-detection value when said detection signal is absent;

run length counter means for counting p-q continued occurrences of a first data value of said m data values from an (i-p+1)-th second data element to an (i-q)-th second data element, as a first run length, and said run length counter means for counting r-s continued occurrences of said detection value from an (i-r+1)-th fourth data element to an (i-s)-th fourth data element, as a second run length, where p, q, r and s are integers such that $1 \leq p < i$, $0 \leq q < p$, $1 \leq r < i$ and $0 \leq s < r$, respectively, and said run length counter means for executing a length comparison between said first and second run lengths when one of a value of an (i+1)-th second data element differs from a value of said i-th second data element and a value of an (i+1)-th fourth data element differs from the value of said i-th fourth data element, said run length counter means adaptively selecting, in response to said length comparison, a partial sequence of second data elements associated with said first run length and a partial sequence of fourth data elements associated with said second run length, either said partial sequence being a sequence of t-u effective data elements;

said run length counter means outputting an effective data sequence comprising M effective data elements in which a partial sequence from the (i-t +1)-th effective data element to the (i-u)-th effective data element comprise said sequence of t-u effective data elements and said remaining effective data elements comprise said partial sequence of second data elements;

said effective data elements each have a value which varies within a set of m+1 data values including said m data values and said detection signal where t and u are different integers, and said run length counter means generating a run length signal representative of a third run length comprising t-u continued occurrences of a repeated value of said m+1 data values from said (i-t+1)-th effective data element to said (i-u)-th effective data element when the value of an (i+1)-th effective data element differs from said i-th effective data element; and Huffman coding means for coding said run length signal to obtain said compressed data sequence by using a Huffman table listing a plurality of Huffman codes not exceeding (m+1)×M.

2. An image coding method for coding, into a compressed data sequence, data sequence including a first data sequence comprising M first data elements in which the i-th data element of said first data elements includes a first image data of a set of coded image data, said first data elements differing among m different data values and a second data sequence comprising M second data elements in which the i-th data element of said second data elements includes a second image of sad set of coded image data, said second data elements differing among m different data values, where M and m are predetermined integers, respectively, and i is an arbitrary integer such that $1 \leq i \leq M$, said method comprising the steps of:

delaying said first data sequence for a predetermined time to output a third data sequence comprising M third data elements in which the i-th data element of said third data elements included said i-th first data element delayed, said third data elements differing among m different data values;

detecting a coincidence said i-th second data element and said i-th third data element;

outputting a coded detection signal representative of said coincidence, said detection signal being distinctive from m data values, said detection signals comprising a fourth data sequence comprising M fourth data elements, the i-th data element of said data elements comprising a detection value when said detection signal is present and a non-detection value when said detection signal is absent;

counting p-q continued occurrences of a first data value of said m data values from an (i-p+1)-th second data element to an (i-q)-th second data element, as a first run length and counting r-s continued occurrences of said detection value from an (i-r+1)-th fourth data element to an (i-s)-th fourth data element, as a second run length, where p,q r and s are integers such that $1 \leq p < i, 0 \leq q < p, 1 \leq r < i$ and $0 \leq s < r$, respectively, and comparing said first and second run lengths when one of a value of an (i+1)-th second data element differs from a value of said i-th second data element and a value of an (i+1)-th fourth data element differs from the value of said i-th fourth data element, adaptively selecting, in response to said length comparison, a partial sequence of second data elements associated with said first run length and a partial sequence of fourth data elements associated with said second run length, either of said partial sequence of said second data elements and said partial sequence of said fourth data elements being a sequence of t-u effective data elements;

outputting an effective data sequence comprising M effective data elements in which a partial sequence from the (i-t+1)-th effective data element to the (i-u)-th effective data element comprise said sequence of t-u effective data elements and said remaining effective data elements comprise said partial sequence of second data elements, said effective data elements each have a value which varies within a set of m+1 data values including said m data values and said detection signal where t and u are different integers, and generating a run length signal representative of a third run length comprising t-u continued occurrences of a repeated value of said m+1 data values from said (i-t+1)-th effective data element to said (i-u)-th effective data element when the value of an (i+1)-th effective data element differs from said i-th effective data element; and coding said run length signal to obtain said compressed data sequence by using a Huffman table listing a plurality of Huffman codes not exceeding (m+1)×M.

* * * * *